(12) United States Patent
Deutschle et al.

(10) Patent No.: US 9,405,870 B2
(45) Date of Patent: Aug. 2, 2016

(54) GENERATING COVERAGE DATA FOR A SWITCH FREQUENCY OF HDL OR VHDL SIGNALS

(75) Inventors: Joerg Deutschle, Winnenden (DE); Lothar Felten, Hauset (BE); Ursel Hahn, Lichtenwald (DE); Klaus Keuerleber, Stuttgart (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2301 days.

(21) Appl. No.: 12/205,476

(22) Filed: Sep. 5, 2008

(65) Prior Publication Data

US 2009/0070717 A1    Mar. 12, 2009

(30) Foreign Application Priority Data

Sep. 6, 2007 (EP) ..................................... 07115784

(51) Int. Cl.
*G06F 17/50* (2006.01)
*G01R 31/3183* (2006.01)
(52) U.S. Cl.
CPC .... *G06F 17/5022* (2013.01); *G01R 31/318364* (2013.01); *G06F 17/505* (2013.01)
(58) Field of Classification Search
CPC ............................ G06F 17/5022; G06F 17/505
USPC ........................... 716/103, 104, 106, 111, 136
See application file for complete search history.

(56) References Cited

U.S. PATENT DOCUMENTS

| 5,555,201 | A | * | 9/1996 | Dangelo et al. | ............... | 716/102 |
| 6,151,568 | A | * | 11/2000 | Allen et al. | ..................... | 703/14 |
| 6,360,353 | B1 | * | 3/2002 | Pember et al. | ................ | 716/103 |
| 6,823,497 | B2 | * | 11/2004 | Schubert et al. | .............. | 716/106 |
| 7,127,384 | B2 | * | 10/2006 | Zolotov et al. | .................. | 703/14 |
| 7,134,100 | B2 | * | 11/2006 | Ravi et al. | ...................... | 716/103 |
| 7,260,804 | B1 | * | 8/2007 | Burstein et al. | .............. | 716/104 |
| 7,334,203 | B2 | * | 2/2008 | Chan | ............................ | 716/108 |
| 7,356,786 | B2 | * | 4/2008 | Schubert et al. | ............. | 716/106 |
| 7,360,193 | B1 | * | 4/2008 | Burstein et al. | .............. | 716/122 |
| 7,392,171 | B2 | * | 6/2008 | Blasi et al. | ...................... | 703/15 |
| 7,735,030 | B1 | * | 6/2010 | Kalil et al. | ..................... | 716/136 |
| 8,196,075 | B1 | * | 6/2012 | Garrault et al. | .............. | 716/104 |
| 8,281,277 | B2 | * | 10/2012 | Hosokawa | ..................... | 716/136 |
| 2006/0277509 | A1 | * | 12/2006 | Tung et al. | ....................... | 716/5 |
| 2007/0022395 | A1 | * | 1/2007 | Ravi et al. | ......................... | 716/5 |
| 2007/0074137 | A1 | * | 3/2007 | Nishida et al. | .................... | 716/5 |
| 2009/0307640 | A1 | * | 12/2009 | Chapman et al. | ................. | 716/4 |
| 2010/0198573 | A1 | * | 8/2010 | Hosokawa | ..................... | 703/14 |
| 2011/0154110 | A1 | * | 6/2011 | Letz et al. | ....................... | 714/33 |

OTHER PUBLICATIONS

Lee, "Successful Mixed-Language Code Coverage with VCS", The Synopsys Verification Avenue Technical Bulletin, vol. 4, issue 4, Dec. 2004, pp. 1-7.

* cited by examiner

*Primary Examiner* — Helen Rossoshek
(74) *Attorney, Agent, or Firm* — Thompson Hine LLP

(57) ABSTRACT

The present invention relates to a method for generating coverage data for a switch frequency of HDL or VHDL signals with the steps of providing a HDL or VHDL hardware description model within a register transfer level, providing a filtering algorithm or filtering rules for signals occurring in the HDL or VHDL hardware description model, extracting signals from the HDL or VHDL hardware description model according to said filtering algorithm or filtering rules in order to get relevant signals, performing a simulation process of the HDL or VHDL hardware description model, performing a checking routine for the relevant signals in every cycle and storing and/or cumulating the relevant signals in a data base. Further the present invention relates to a corresponding system.

3 Claims, 1 Drawing Sheet

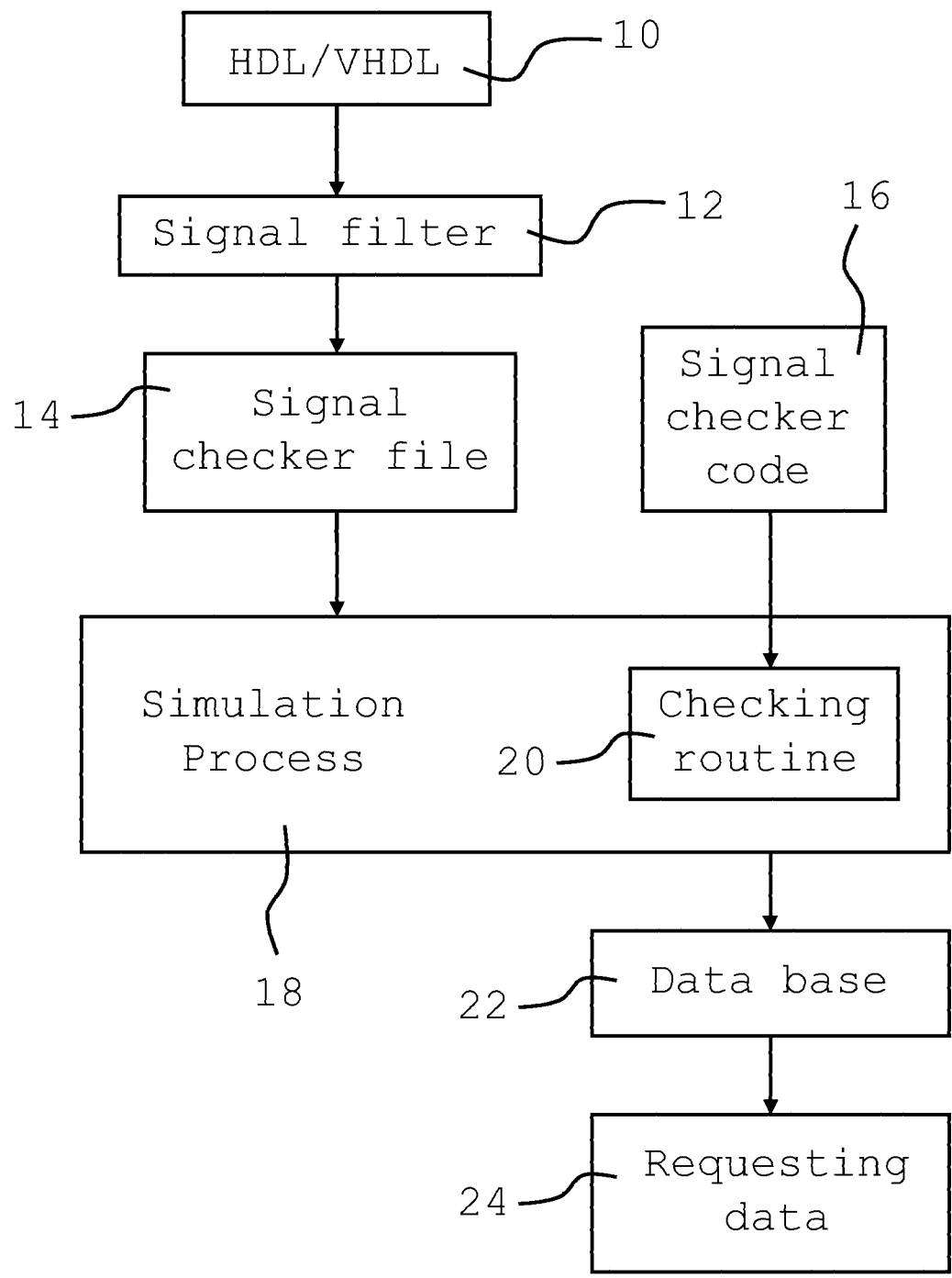

GENERATING COVERAGE DATA FOR A SWITCH FREQUENCY OF HDL OR VHDL SIGNALS

BACKGROUND OF THE INVENTION

1. Field of the Invention

The present invention relates to a method and a system for generating coverage data for a switch frequency of HDL or VHDL signals in a cycle simulation.

2. Description of the Related Art

The verification of the logical correctness of a digital circuit design is an important process during the development of said circuit design. This said design is called device under test (DUT) in verification. The verification may be realized by a simulation process, i.e. in this case a cycle simulation process, of the DUT on a computer. Typically, the hardware designer provides a model written in a hardware description language (HDL), such as VHDL (very high speed integrated circuit hardware description language).

In the simulation of a complex hardware model a lot of signals occur. The values of all or selected signals of the simulation cycle during the whole simulation process are contained in an all-event-trace (AET). The large number of signals results in large AETs. It would be advantageous if the AETs contain only the values of the important signals. Such an AET is used for the determination of the switch frequency of the signals after the end of the simulation process.

The main function of the simulation process is the verification of the logical correctness of the hardware model and the hardware itself. In a complex hardware it is difficult to assure that all paths of the hardware are checked. It becomes more important to check certain single groups of signals during the simulation process. Such groups of signals may be input and output signals, power latch signals, spare latch signals and disable logic signals.

The U.S. Pat. No. 6,920,418 B2 describes a method for monitoring events within a simulation model. Those signals, which have to be checked, are defined by an additional VHDL code during the model is built. In the end of the simulation the signal to be checked are transmitted to a data base. This method requires that the signal must be already defined at the time of building the model. Additional signals require the building of a new model restart cycle simulation. The signals have to be inserted manually into the HDL. The use of a filter is not possible.

The U.S. Pat. No. 7,194,400 B2 describes a simulation control program, which receives a HDL model including design entities and count event registers. Each count event register is associated with a respective instance of an event. The count event registers are an integrated part of the HDL model. The HDL model describes the circuit design as well as the relevant fact of the simulation process. Thus, the simulation process is predetermined by the HDL model. When the HDL model is provided, then a variation of the signals for those you want to observe the switch frequency during the cycle simulation process is not possible.

OBJECT OF THE INVENTION

It is an object of the present invention to provide an improved method and system for generating coverage data for a switch frequency of HDL or VHDL signals.

SUMMARY OF THE INVENTION

The above object is achieved by a method as laid out in the independent claims. Further advantageous embodiments of the present invention are described in the dependent claims and are taught in the description below.

The advantages of the invention are achieved by extracting all relevant signals from the HDL or VHDL hardware description by a signal filter. This extraction is performed before the proper simulation process. Said signals are stored in a special data file. Said data file is used for requesting the signals during the proper simulation process. Each of the signals in said data file is then checked and its state is transmitted to a data base.

The signal filter generates lists of signals which are held in one or more signal checker files. The signal filter includes or applies rules or criteria for the extractions. For each simulation process another signal checker file can be chosen.

The VHDL hardware description is available in a register transfer level (RTL). This allows the filtering or parsing or use of the source code of the VHDL hardware description. Alternatively, a net list description of the hardware model may be analyzed.

In the preferred embodiment of the present invention the extraction is performed on the provided VHDL/HDL. Alternatively, the net list can be used after building of the hardware model. In another embodiment of the present invention the extraction may be performed during the building of the hardware model.

BRIEF DESCRIPTION OF THE DRAWINGS

The above as well as additional objectives, features and advantages of the present invention will be apparent in the following detailed written description.

The novel and inventive features believed characteristics of the invention are set forth in the appended claims. The invention itself, their preferred embodiments and advantages thereof will be best understood by reference to the following detailed description of preferred embodiments in conjunction with the accompanied drawings, wherein:

FIG. 1 illustrates a schematic diagram of a method according to the preferred embodiment of the present invention.

DETAILED DESCRIPTION OF THE INVENTION

FIG. 1 illustrates a schematic diagram of a method according to a preferred embodiment of the present invention.

A HDL or VDHL hardware description 10 is provided by a designer. The HDL or VDHL hardware description 10 has to be analyzed. Preferably, the source code of the HDL or VDHL hardware description 10 is analyzed. In this case the HDL or VDHL hardware description 10 must be available within a register transfer level (RTL).

Alternatively, the analyses of an RTL net list description of the hardware model may be used.

A signal filter 12 extracts the signals from the HDL or VDHL hardware description 10 according to a predetermined filter algorithm. According to the present invention the extraction of the signals is done before the proper simulation process.

The extracted relevant signals are stored in a signal checker file 14. Each signal in said signal checker file 14 is checked by a checking routine 20 during a simulation process 18. A signal checker code 16 is provided in order to supply the checking routine with the signals from the signal checker file 14 and is also responsible to send the collected data to the data base 22. The checking routine 20 checks the signals in every cycle. It is also possible to check said signals only if they have changed.

After the simulation process the switch frequencies of the signals are transmitted to a data base 22. The switch frequency of the relevant signals is cumulated in said data base 22. In a step of requesting data 24 the stored data of the relevant signal may be requested via an appropriate interface.

The filter is realized as a software program. Every user may create a special filter program according to the individual requirements. The filter program may be written in an arbitrary programming language. In this embodiment the filter program may be a batch file. In that batch file the filter rules get applied while parsing HDL or VHDL.

A predetermined scheme for the selection of the signal names is provided. The use of said predetermined scheme allows pattern matching process. For example, the pattern "POWERSAVE" allows the checking of all power latches.

In the preferred embodiment a signal checker file is used. For example, the name of the signal checker file may be "SignalChecker.cfg". In an entity list of the HDL hardware description all input and output signals for the device under test are written into said signal checker file. The signal checker file may be used directly in the simulation, if the circuit design is relative small and the names of the signals are not changed during the compilation of the HDL.

If the device under test is a part of a big design, e.g. a core of a central processor unit, then the names of the signals are changed during the compilation of the HDL hardware description. By an attached pattern matching process of the signal checker file with the net list, a set of new names for the signals may be provided.

Alternatively, the signal checker file may be created during the compilation of the VHDL hardware description, if the compiler supports this.

According to the present invention the HDL or VHDL hardware description and the filtering algorithm are provided as separate files. The selection of the extracted signals is independent of the HDL or VHDL hardware description. The filtering algorithm may be changed without a modification of the HDL or VHDL hardware description.

Preferably, the filtering algorithm relates to signals or signal groups, which are following naming conventions.

The present invention can also be embedded in a computer program product, which comprises all the features enabling the implementation of the methods described herein. Further, when loaded in computer system, said computer program product is able to carry out these methods.

Although illustrative embodiments of the present invention have been described herein with reference to the accompanying drawings, it is to be understood that the present invention is not limited to those precise embodiments, and that various other changes and modifications may be performed therein by one skilled in the art without departing from the scope or spirit of the invention. All such changes and modifications are intended to be included within the scope of the invention as defined by the appended claims.

LIST OF REFERENCE NUMERALS

10 HDL/VHDL hardware description
12 signal filter
14 signal checker file
16 signal checker code
18 step of performing the simulation
20 checking routine
22 data base
24 step of requesting data

The invention claimed is:

1. A method for generating coverage data for a switch frequency of hardware description language (HDL) signals, comprising the steps of:
   providing, by a processor, a HDL hardware description model within a register transfer level;
   providing, by the processor, a filtering algorithm for signals occurring in the HDL hardware description model;
   extracting, by the processor, a subset of signals from the HDL hardware description model according to said filtering algorithm in order to get relevant signals;
   after the subset of signals have been extracted, performing, by the processor, a cycle simulation process on a compiled representation of the HDL hardware description model, including performing a checking routine for the relevant signals in every cycle; and
   storing, by the processor, switch frequencies of the relevant signals in a data base, wherein the relevant signals are at least one of signals and latches which control power of a device under test.

2. A method for generating coverage data for a switch frequency of hardware description language (HDL) signals, comprising the steps of:
   providing, by a processor, a HDL hardware description model within a register transfer level;
   providing, by the processor, a filtering algorithm for signals occurring in the HDL hardware description model;
   extracting, by the processor, a subset of signals from the HDL hardware description model according to said filtering algorithm in order to get relevant signals;
   after the subset of signals have been extracted, performing, by the processor, a cycle simulation process on a compiled representation of the HDL hardware description model, including performing a checking routine for the relevant signals in every cycle; and
   storing, by the processor, switch frequencies of the relevant signals in a data base, wherein the relevant signals are spare latch signals associated with spare latches of a device under test.

3. A method for generating coverage data for a switch frequency of hardware description language (HDL) signals, comprising the steps of:
   providing, by a processor, a HDL hardware description model within a register transfer level;
   providing, by the processor, a filtering algorithm for signals occurring in the HDL hardware description model;
   extracting, by the processor, a subset of signals from the HDL hardware description model according to said filtering algorithm in order to get relevant signals;
   after the subset of signals have been extracted, performing, by the processor, a cycle simulation process on a compiled representation of the HDL hardware description model, including performing a checking routine for the relevant signals in every cycle; and
   storing, by the processor, switch frequencies of the relevant signals in a data base, wherein the relevant signals that are extracted are signals which have a matching name convention.

* * * * *